(12) United States Patent
Hirschmann et al.

(10) Patent No.: US 12,578,372 B2
(45) Date of Patent: Mar. 17, 2026

(54) MEASUREMENT DEVICE AND METHOD FOR PERFORMING A VECTOR SIGNAL ANALYSIS

(71) Applicant: Rohde & Schwarz GmbH & Co. KG, Munich (DE)

(72) Inventors: Susanne Hirschmann, Dachau (DE); Florian Ramian, Karlsfeld (DE); Michael Simon, Rosenheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 217 days.

(21) Appl. No.: 18/443,450

(22) Filed: Feb. 16, 2024

(65) Prior Publication Data

US 2025/0264512 A1 Aug. 21, 2025

(51) Int. Cl.
*G01R 29/08* (2006.01)

(52) U.S. Cl.
CPC ................................. *G01R 29/0878* (2013.01)

(58) Field of Classification Search
CPC ............ G01R 29/0892; G01R 29/0878; H04B 17/25; H04B 17/21; H04B 17/0085; H04B 17/309; H04L 1/20
See application file for complete search history.

(56) References Cited

U.S. PATENT DOCUMENTS

| | | | | |
|---|---|---|---|---|
| 11,435,394 | B1 * | 9/2022 | Noujeim | G01R 31/2832 |
| 2007/0080699 | A1 * | 4/2007 | Betts | C03C 25/26 |
| | | | | 702/190 |
| 2015/0304075 | A1 * | 10/2015 | Ahmed | H04L 27/2637 |
| | | | | 375/228 |
| 2021/0344579 | A1 * | 11/2021 | Hirschmann | H04L 43/045 |

OTHER PUBLICATIONS

Xu et al.; Design and Optimization of Differential Chaos Shift Keying Scheme With Code Index Modulation, IEEE Transactions on Communications; vol. 66, No. 5; May 2018; pp. 1970-1980.

* cited by examiner

*Primary Examiner* — Eman A Alkafawi
*Assistant Examiner* — Suresh K Rajaputra
(74) *Attorney, Agent, or Firm* — Studebaker Brackett PLLC

(57) ABSTRACT

The present disclosure relates to a measurement device for performing a vector signal analysis. The measurement device includes an input port which is arranged for being connected to a device under test (DUT). The input port is configured to receive a repetitive measurement signal from the DUT and a processor is configured to determine a reference signal based on at least one repetition of the received measurement signal. The processor is configured to iteratively adapt the determined reference signal over at least one further repetition of the measurement signal.

11 Claims, 3 Drawing Sheets

MEASUREMENT DEVICE AND METHOD FOR PERFORMING A VECTOR SIGNAL ANALYSIS

TECHNICAL FIELD

The disclosure relates to a measurement device and to a method for performing a vector signal analysis.

BACKGROUND ART

In vector signal analysis (VSA), the quality of a measurement signal that is transmitted by a device under test (DUT) is compared against an ideal signal, also referred to as: reference signal. To ensure correct VSA measurements, it is essential that the reference signal is correct in the sense that it is based on the same symbols as the measurement signal.

VSA applications commonly extract the reference signal from the measurement signal. However, detection errors may thereby occur if e.g. the SNR of the measurement signal is low. To ensure a correct reference signal, such detection errors should either be avoided or corrected. However, correcting detection errors requires knowledge about the actual bit sequence in the measurement signal, which is sometimes unknown or only insufficiently known. Currently, if a user has no means to provide the actual bit sequence of the measurement signal, he may not be able to detect and correct a potentially incorrect reference signal which can lead to incorrect VSA measurements.

SUMMARY

Thus, there is a need to provide an improved measurement device and an improved method for performing a vector signal analysis which avoid the above-mentioned disadvantages.

These and other objectives are achieved by the embodiments provided in the enclosed independent claims. Advantageous implementations of the present disclosure are further defined in the dependent claims.

According to a first aspect, the present disclosure relates to a measurement device for performing a vector signal analysis. The measurement device comprises: an input port which is arranged for being connected to a device under test, DUT; wherein the input port is configured to receive a repetitive measurement signal from the DUT; and a processor which is configured to determine a reference signal based on at least one repetition of the received measurement signal; wherein the processor is configured to iteratively adapt the determined reference signal over at least one further repetition of the measurement signal.

This provides the advantage that a correct reference signal can be provided, even in low SNR environments. As a consequence, incorrect VSA measurement which are caused by faulty reference signals can be avoided.

The measurement device can be a vector signal analyzer or a measurement instrument with a vector signal analysis functionality.

The DUT can be a communication device. The measurement signal can be an RF signal transmitted by the DUT. The measurement signal can be an I/Q signal. For instance, the measurement signal comprises symbols which are transmitted with a determined symbol rate.

The repetitive measurement signal can be repeatedly transmitted by the DUT and/or repeatedly captured by the measurement device. Alternatively, multiple repetitions of the measurement signals can be received in one capture.

The reference signal can be an idealized (e.g., error-free and/or undisturbed) version of the measurement signal. The reference signal can comprise the same symbols and/or symbol sequence as the measurement signal. A VSA measurement can comprise a comparison of the reference signal and the measurement signal.

The input port can be an RF port.

The processor can be an ASIC or microprocessor of the measurement device.

The processor can be configured to adapt the determined reference signal over multiple further repetitions (and/or captures) of the measurement signal. An adaption may be carried out after each repetition/capture.

In an embodiment, the processor is configured to iteratively adapt the reference signal based on deterministic corrections and/or based on statistical error corrections over multiple repetitions of the measurement signal.

For example, in subsequent repetitions, which are captured by the measurement device, different deterministic corrections can be applied (e.g., channel filter etc.).

In an embodiment, the processor is configured to adapt the reference signal by I/Q averaging over at least two repetitions of the measurement signal and/or by calculating a probability distribution of symbols over at least two repetitions of the measurement signal.

For instance, the processor can generate a histogram showing a symbol point distribution across at least two repetitions of the measurement signal. Symbols which occur most frequently at one point of the measurement signal can be estimated to be the correct ones. Furthermore, the processor can be configured to correct non-linearities in the measurement signal that e.g. always occur at the same symbol, which is a common WiFi 7 issue.

In an embodiment, the processor is configured to adapt the reference signal by performing a noise cancellation, an equalization, a channel filtering and/or a digital pre-distortion (DPD).

In an embodiment, the processor is configured to calculate a signal quality metric of the DUT based on a comparison of the measurement signal with the adapted reference signal. This provides the advantage that the processor can carry out VSA measurements with the adapted reference signal. For instance, the processor can thereby calculate an error vector magnitude (EVM).

In an embodiment, the processor is configured to perform a quality estimation of the adapted reference signal. For example, the processor performs the quality estimation of the adapted reference signal after each adaption of the reference signal.

In an embedment, the quality estimation comprises determining a degree of change of the reference signal after at least the latest adaption of the reference signal.

In an embodiment, the processor is configured to stop a further adaption of the reference signal if the quality estimation yields that the adapted reference signal fulfills a quality condition.

In other words, the processor can freeze the adaption of the reference time, if the quality condition is fulfilled, i.e. if the processor detects that the reference signal is "good enough". For instance, the quality condition is fulfilled when the adaption of the reference signal causes a change of a signal characteristic which is smaller than a threshold value.

In an embodiment, if the further adaption of the reference signal is stopped, the processor is configured to extract symbols from the adapted reference signal; wherein the processor is configured to store the extracted symbols in a memory of the measurement device. This provides the advantage that the stored symbols can be used for subsequent VSA measurements.

For instance, the processor can extract symbols from the reference signal via a demodulation of the reference signal.

In an embodiment, the processor is configured to demodulate the measurement signal in order to detect symbols in the measurement signal; and to calculate a symbol error rate and/or a bit error rate by comparing the detected symbols with pre-extracted symbols from the adapted reference signal.

For instance, the pre-extracted symbols are the symbols stored in the memory.

According to a second aspect, the present disclosure relates to a method for performing a vector signal analysis. The method comprises: connecting a device under test, DUT, to an input port of a measurement device; receiving, at the input port, a repetitive measurement signal from the DUT; determining a reference signal based on at least one repetition of the received measurement signal; and iteratively adapting the determined reference signal over at least one further repetition of the measurement signal.

The method according to the second aspect of the disclosure can be carried out by the measurement device according to the first aspect of the disclosure.

BRIEF DESCRIPTION OF THE DRAWINGS

The above-described aspects and implementation forms of the present disclosure will be explained in the following description of specific embodiments in relation to the enclosed drawings, in which.

DETAILED DESCRIPTIONS OF EMBODIMENTS

Figure 1:
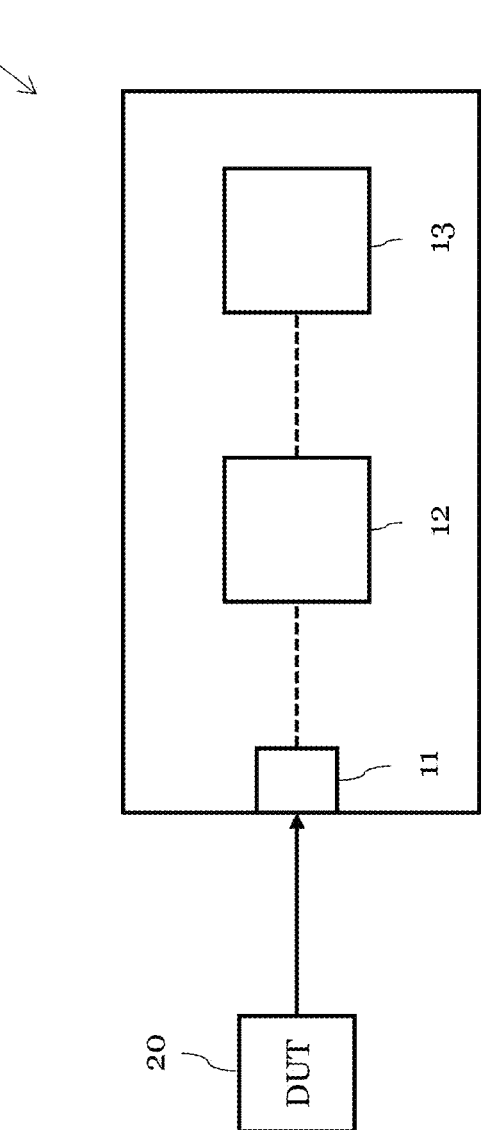
FIG. 1 shows schematic diagram of a measurement device for performing a vector signal analysis according to an embodiment.

FIG. 1 shows a schematic diagram of a measurement device 10 for performing a vector signal analysis according to an embodiment.

The measurement device 10 comprises an input port 11 which is arranged for being connected to a DUT 20, wherein the input port 11 is configured to receive a repetitive measurement signal from the DUT 20. The measurement device 10 further comprises a processor 12 which is configured to determine a reference signal based on at least one repetition of the received measurement signal; wherein the processor 12 is configured to iteratively adapt the determined reference signal over at least one further repetition of the measurement signal.

The measurement device 10 can be a vector signal analyzer or a measurement instrument with a vector signal analysis (VSA) functionality. The measurement device 10 can carry out a VSA measurement. During a VSA measurement, the quality of the measurement signal can be determined by comparing it against the reference signal. The measurement device 10 can reconstructs the reference signal from the measurement signal that is transmitted by the DUT 20.

The reference signal can be an idealized (e.g., e.g., error-free and/or undisturbed) version of the measurement signal. The reference signal can comprise the same symbols and/or symbol sequence as the measurement signal.

For instance, the measurement device 10 first determines an initial reference signal from at least one repetition of the measurement signal. This initial reference signal may contain errors. The measurement device 10 then iteratively adapts the reference signal until reaching an "improved" (i.e., corrected) reference signal. After determining this improved reference signal, the measurement device 10 can compare the measurement signal to the improved reference signal as part of a VSA measurement. For instance, the measurement device 10 can measure a bit error rate (BER) or a symbol error rate (SER) of the measurement signal. BER/SER measurements can be a direct measure for the throughput of a complex DUT. The measurement device 10 can further carry out an error vector magnitude (EVM) measurement.

By iteratively adapting the reference signal, the measurement device 10 can detect and correct errors in the reference signal (e.g., possible symbol decision errors), thus ensuring correct VSA measurements. Thereby, the reference signal can be determined by the device 10 itself (via the iterative approach) and does not require an externally provided reference signal or transmitted symbol sequence. Also, no visual inspection (e.g., of constellation diagram) is required to detect an incorrect reference signal. For instance, the measurement device 10 can carry out BER/SER measurements, even if no knowledge about the measurement signal is available.

The DUT 20 can be a communication device. The DUT can have an output port for outputting the measurement signal.

The measurement signal can be an RF signal. The measurement signal can be an I/Q signal. For instance, the measurement signal comprises symbols which are transmitted at a certain symbol rate. A symbol can encode one or more binary digits (bits).

The repetitive measurement signal can be repeatedly transmitted by the DUT 20 and/or repeatedly captured by the measurement device 10. Alternatively, multiple repetitions of the measurement signals can be received in one capture.

The input port 11 can be an RF port. The measurement device 10 can be connected to the DUT 20 via a cable.

The processor 12 can be an ASIC or microprocessor of the measurement device 10.

The processor 12 can be configured to adapt the determined reference signal over multiple repetitions (and/or captures) of the measurement signal, wherein an adaption may be carried out after each repetition/capture.

The measurement device 10 can further comprise a memory 13, e.g. a flash memory. For instance, symbols extracted from the adapted reference signal can be stored in the memory.

After receiving one or more captures of the repetitive measurement signal, the processor can exploit all or a subset of the captured signals (i.e., of the measurement signal repetitions) to iteratively adapt and thereby improve the reference signal.

For instance, the processor 12 can be configured to adapt the reference signal based on deterministic corrections. In addition or alternatively, the processor 12 can be configured to adapt the reference signal based on statistical error corrections over multiple repetitions of the measurement signal.

The statistical error corrections may comprise an I/Q averaging of the reference and/or measurement signal to reduce DUT and/or VSA noise. The processor 12 can further carry out an I/Q noise cancellation.

In addition or alternatively, the processor 12 can carry out any one of the following measures on the measurement and/or reference signal: equalization or channel filtering; digital pre-distortion (DPD); or taking a symbol decision based on an estimated probability distribution (e.g., via a histogram on symbol instances).

Furthermore, the DUT 20 or parts of the DUT 20 can be disconnected step-by-step from the measurement device 10 (e.g. component test) and a corrected reference signal can be recorded each time.

The processor 12 can be configured to compare the adapted reference signal to the measurement signal in order to determine signal quality metrics of the DUT 20. This can be done after each adaption of the reference signal and/or after a final adaption (i.e., freezing) of the reference signal.

For instance, the signal quality metric can be an error vector quality (EVM) value. To calculate the EVM value, the complex baseband (adapted) reference signal can be subtracted from the complex baseband measurement signal, wherein the magnitude of this error vector represents the EVM value. If the EVM value is low, the signal quality of the DUT is high.

Figure 2:
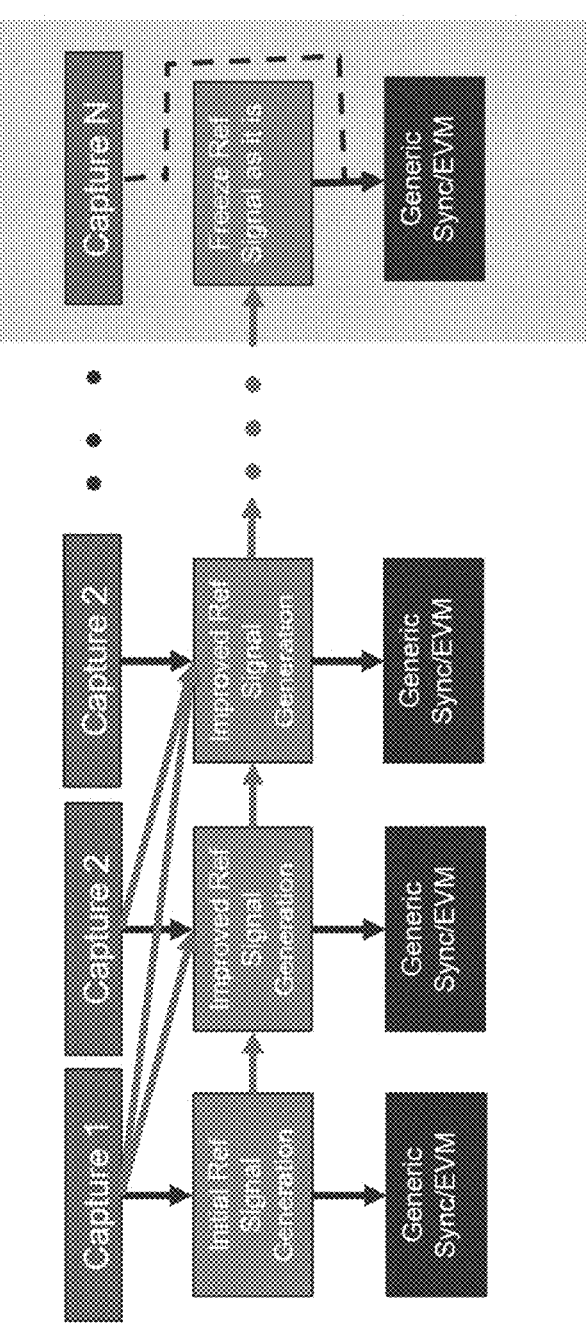
FIG. 2 shows a working principle of the measurement device shown in FIG. 1 according to an embodiment.

FIG. 2 shows a working principle of the measurement device 10, in particular of the iterative adaption of the reference signal, according to an embodiment.

After a first capture of the measurement signal, an initial reference signal (initial ref.) can be generated. Based on this initial reference signal, a generic synchronization or an EVM measurement can be performed.

After subsequent captures of the measurement signal, the initial reference signal can be adapted generating an improved reference signal. With each adapted reference signal, a respective generic synchronization or an EVM measurement can be performed.

After each adaption, the processor 12 can perform a quality estimation of the adapted reference signal. For instance, the quality estimation comprises determining a degree of change of the reference signal after at least the latest adaption of the reference signal.

In an example, the processor 12 compares each newly generated (or adapted) reference signal in a step N to the previously generated reference signal(s) in steps (N–1), (N–2), . . . and decides, whether the reference signal is stable.

For instance, the processor 12 can use a metric to determine if the reference signal is "good enough", e.g. stable within a certain measurement uncertainty, or needs further adaption. The metric can consider the stability of the signal based on various factors, such as: histograms (e.g., if a symbol does not change), exploited codes on signal, calculated parameters (e.g., EVM, bit error rate, or symbol error rate), or a space between the ideal constellation points and reference signal detected points.

The processor 12 can then "freeze" the reference signal (i.e., no longer adapt the reference signal) when it is stable. In other words, the processor 12 stops a further adaption of the reference signal if the quality estimation yields that the adapted reference signal fulfills a quality condition. The quality condition can be a change of a signal characteristic before and after the adaption being smaller than a threshold value.

If the further adaption of the reference signal is stopped (i.e., the reference signal is frozen), the processor 12 can be configured to extract symbols from the adapted reference signal, e.g. via demodulation. The processor 12 can then store these symbols (of the stable reference signal) in the memory 13. In this way, subsequent measurement can be sped up, because the reference signals can be retrieved from the memory and do not have to be re-calculated.

The processor can use the frozen reference signal, which was generated via the iterative adaption, for performing VSA measurements. For instance, the processor 12 can demodulate the measurement signal to extract the symbols and compare these symbols to the pre-extracted symbols of the "frozen" reference signal (e.g., the stored symbols in the memory which were extracted after freezing the reference signal). In this way, a SER or BER measurements with the measurement signal can be carried out or possible symbol decision errors can be detected without having to determine and/or demodulate the reference signal each time.

Figure 3:
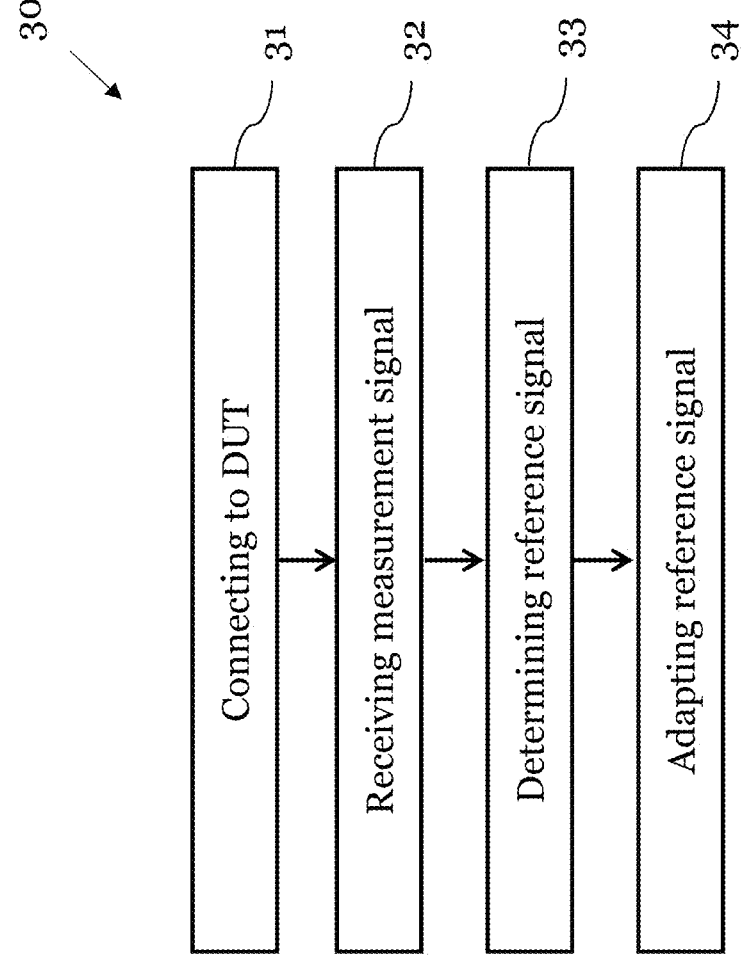
FIG. 3 shows a flow diagram of a method for performing a vector signal analysis according to an embodiment.

FIG. 3 shows a flow diagram of a method 30 for performing a vector signal analysis according to an embodiment. The method 30 can be carried out with the measurement device 10 as e.g. shown in FIG. 1

The method 30 comprises: connecting 31 the DUT 20 to the input port 11, e.g., of the measurement device 10; receiving 32, at the input port 11, the repetitive measurement signal from the DUT 20; determining 33 the reference signal based on at least one repetition of the received measurement signal; and iteratively adapting 34 the determined reference signal over at least one further repetition of the measurement signal.

The method 30 may further comprise: carrying out a VSA measurement with the DUT 20 (e.g., a EMV, a BER, or a SER measurement) using the adapted reference signal.

All features described above or features shown in the figures can be combined with each other in any advantageous manner within the scope of the disclosure.

The invention claimed is:

1. A measurement device for performing a vector signal analysis, comprising:
   an input port which is arranged for being connected to a device under test, DUT;
   wherein the input port is configured to receive a repetitive measurement signal from the DUT; and
   a processor which is configured to determine a reference signal based on at least one repetition of the received measurement signal;
   wherein the processor is configured to iteratively adapt the determined reference signal over at least one further repetition of the measurement signal.

2. The measurement device of claim 1,
   wherein the processor is configured to iteratively adapt the reference signal based on deterministic corrections and/or based on statistical error corrections over multiple repetitions of the measurement signal.

3. The measurement device of claim 1,
   wherein the processor is configured to adapt the reference signal by I/Q averaging over at least two repetitions of the measurement signal and/or by calculating a probability distribution of symbols over at least two repetitions of the measurement signal.

4. The measurement device of claim 1,
   wherein the processor is configured to adapt the reference signal by performing a noise cancellation, an equalization, a channel filtering and/or a digital pre-distortion.

5. The measurement device of claim 1,
   wherein the processor is configured to calculate a signal quality metric of the DUT based on a comparison of the measurement signal with the adapted reference signal.

6. The measurement device of claim 1, wherein the processor is configured to perform a quality estimation of the adapted reference signal.

7. The measurement device of claim 6, wherein the quality estimation comprises determining a degree of change of the reference signal after at least the latest adaption of the reference signal.

8. The measurement device of claim 6, wherein the processor is configured to stop a further adaption of the reference signal if the quality estimation yields that the adapted reference signal fulfills a quality condition.

9. The measurement device of claim 8, wherein, if the further adaption of the reference signal is stopped, the processor is configured to extract symbols from the adapted reference signal;

wherein the processor is configured to store the extracted symbols in a memory of the measurement device.

10. The measurement device of claim 1, wherein the processor is configured to demodulate the measurement signal in order to detect symbols in the measurement signal;

wherein the processor is configured to calculate a symbol error rate and/or a bit error rate by comparing the detected symbols with pre-extracted symbols from the adapted reference signal.

11. A method for performing a vector signal analysis, comprising:

connecting a device under test, DUT, to an input port of a measurement device;

receiving, at the input port, a repetitive measurement signal from the DUT;

determining a reference signal based on at least one repetition of the received measurement signal; and iteratively adapting the determined reference signal over at least one further repetition of the measurement signal.

* * * * *